(12) United States Patent
Krueger et al.

(10) Patent No.: US 12,365,051 B2
(45) Date of Patent: Jul. 22, 2025

(54) METHOD AND DEVICE FOR PROVIDING THROUGH-OPENINGS IN A SUBSTRATE AND A SUBSTRATE PRODUCED IN SAID MANNER

(71) Applicant: LPKF LASER & ELECTRONICS AG, Garbsen (DE)

(72) Inventors: Robin Alexander Krueger, Hannover (DE); Norbert Ambrosius, Kevelaer (DE); Roman Ostholt, Langenhagen (DE)

(73) Assignee: LPKF LASER & ELECTRONICS SE, Garbsen (DE)

( * ) Notice: Subject to any disclaimer, the term of this patent is extended or adjusted under 35 U.S.C. 154(b) by 138 days.

(21) Appl. No.: 18/175,557

(22) Filed: Feb. 28, 2023

(65) Prior Publication Data

US 2023/0201970 A1    Jun. 29, 2023

Related U.S. Application Data

(63) Continuation of application No. 16/798,453, filed on Feb. 24, 2020, now Pat. No. 11,618,104, which is a
(Continued)

(30) Foreign Application Priority Data

Apr. 4, 2013    (DE) .................... 10 2013 103 370.9
Oct. 31, 2013   (DE) .................... 10 2013 112 033.4

(51) Int. Cl.
*B23K 26/382* (2014.01)
*B23K 26/00* (2014.01)
(Continued)

(52) U.S. Cl.
CPC ........ *B23K 26/382* (2015.10); *B23K 26/0006* (2013.01); *B23K 26/0624* (2015.10);
(Continued)

(58) Field of Classification Search
CPC .............. B23K 26/382; B23K 26/0006; B23K 26/0624; B23K 26/064; B23K 26/402;
(Continued)

(56) References Cited

U.S. PATENT DOCUMENTS 4,911,783 A    3/1990    Voboril
5,472,828 A    12/1995   Akins
(Continued)

FOREIGN PATENT DOCUMENTS

CN    101571603 A    11/2009
CN    102513700 A    6/2012
(Continued)

*Primary Examiner* — John P. Dulka
(74) *Attorney, Agent, or Firm* — LEYDIG, VOIT & MAYER, LTD.

(57) ABSTRACT

A substrate comprises glass, sapphire, silicon and/or aluminosilicate, and has at least one recess or through-opening. The at least one recess or through-opening is formed by anisotropic removal of substrate material by etching a portion of the substrate that has been modified by a pulse of laser radiation in a direction of a thickness of the substrate. The modified portion of the substrate extends along a beam axis of the laser radiation. The pulse of laser radiation was applied with a focus extending from a first focal depth positioned past one side of the substrate to a second focal depth located at an opposite side of the substrate.

21 Claims, 5 Drawing Sheets

Related U.S. Application Data continuation of application No. 14/781,599, filed as application No. PCT/DE2014/100118 on Apr. 3, 2014, now Pat. No. 10,610,971.

(51) Int. Cl.

| | | |
|---|---|---|
| *B23K 26/0622* | (2014.01) | |
| *B23K 26/064* | (2014.01) | |
| *B23K 26/402* | (2014.01) | |
| *B23K 26/53* | (2014.01) | |
| *B23K 101/40* | (2006.01) | |
| *B23K 103/00* | (2006.01) | |
| *H01L 21/48* | (2006.01) | |
| *H01L 23/14* | (2006.01) | |
| *H01L 23/15* | (2006.01) | |
| *H01L 23/498* | (2006.01) | |

(52) U.S. Cl.
CPC .......... *B23K 26/064* (2015.10); *B23K 26/402* (2013.01); *B23K 26/53* (2015.10); *H01L 21/486* (2013.01); *B23K 2101/40* (2018.08); *B23K 2103/50* (2018.08); *B23K 2103/54* (2018.08); *B23K 2103/56* (2018.08); *H01L 23/147* (2013.01); *H01L 23/15* (2013.01); *H01L 23/49827* (2013.01)

(58) Field of Classification Search
CPC ................ B23K 26/53; B23K 2101/40; B23K 2103/50; B23K 2103/54; B23K 2103/56; B23K 26/50; B23K 26/18; H01L 21/486; H01L 23/147; H01L 23/15; H01L 23/49827

See application file for complete search history.

(56) References Cited

U.S. PATENT DOCUMENTS

| | | |
|---|---|---|
| 6,400,172 B1 | 6/2002 | Akram et al. |
| 2005/0145605 A1 | 7/2005 | Faour |
| 2007/0298529 A1 | 12/2007 | Maeda et al. |
| 2010/0236819 A1 | 9/2010 | Chiang et al. |
| 2012/0142186 A1* | 6/2012 | Shimoi .............. B23K 26/0006 257/E21.586 |
| 2012/0234807 A1 | 9/2012 | Sercel |
| 2012/0261179 A1 | 10/2012 | Yamamoto et al. |
| 2013/0029092 A1 | 1/2013 | Wakioka |
| 2013/0126573 A1 | 5/2013 | Hosseini |
| 2013/0210245 A1 | 8/2013 | Jackl |
| 2014/0231390 A1 | 8/2014 | Nukaga |
| 2016/0067822 A1 | 3/2016 | Arai et al. |
| 2016/0107925 A1 | 4/2016 | Burket et al. |
| 2016/0152516 A1 | 6/2016 | Bazemore et al. |
| 2016/0280580 A1 | 9/2016 | Bohme |

FOREIGN PATENT DOCUMENTS

| | | |
|---|---|---|
| CN | 104334312 A | 2/2015 |
| DE | 10154361 A1 | 5/2003 |
| DE | 102010025966 B4 | 1/2012 |
| EP | 2503859 A1 | 9/2012 |
| JP | 2001242495 A | 9/2001 |
| JP | 2005288501 A | 10/2005 |
| JP | 2005288503 A | 10/2005 |
| JP | 2008288577 A | 11/2008 |
| JP | 2009176926 A | 8/2009 |
| JP | 2011134982 A | 7/2011 |
| JP | 2011222700 A | 11/2011 |
| KR | 20100120297 A | 11/2010 |
| KR | 20110139007 A | 12/2011 |
| WO | WO 2012006736 A2 | 1/2012 |
| WO | WO 2012014718 A1 | 2/2012 |
| WO | WO 2012094737 A1 | 7/2012 |

* cited by examiner

METHOD AND DEVICE FOR PROVIDING THROUGH-OPENINGS IN A SUBSTRATE AND A SUBSTRATE PRODUCED IN SAID MANNER

CROSS-REFERENCE TO RELATED APPLICATIONS

This application is a continuation application of U.S. application Ser. No. 16/798,453 filed on Feb. 24, 2020, now U.S. Pat. No. 11,618,104, which is a continuation application of U.S. application Ser. No. 14/781,599 filed on Oct. 1, 2015, now U.S. Pat. No. 10,610,971, which is a U.S. national stage application under 35 U.S.C. § 371 of International Application No. PCT/DE2014/100118, filed on Apr. 3, 2014, and claims benefit to German Patent Application Nos. DE 10 2013 103 370.9, filed on Apr. 4, 2013, and DE 10 2013 112 033.4, filed on Oct. 31, 2013. The International Application was published in German on Oct. 9, 2014 as WO 2014/161534 A2 under PCT Article 21 (2).

FIELD

The invention relates to a method and a device for providing a plurality of through-holes in a substrate, which is usable as an interposer or microcomponent, using a laser beam. The invention further relates to a substrate provided with through-holes which is produced in this manner.

BACKGROUND

Substrates of this type are used as interposers for electrically connecting the terminals of a plurality of homogeneous or heterogeneous microchips. The interposer generally consists of glass or silicon and contains, for example, contact faces, rewiring connections, through-plating and active and inactive components.

As a processor core, a microchip typically has several hundred contact points, narrowly spaced apart from one another, distributed over a relatively small area on the lower face thereof. Because of this narrow spacing, these contact points cannot be applied directly to a circuit board, known as the motherboard. An interposer, by means of which the contacting base can be spread, is therefore used as a connecting element.

In practice, a glass-fiber-reinforced epoxy resin plate, for example, is used as an interposer and is provided with a number of holes. Conductor traces extend on the upper face of the glass fiber mat, and lead into the respective holes so as to fill them, and lead to the terminal contacts of the processor core on the other face of the glass fiber mat. In the event of heating, however, different expansions occur in the core processor and in the glass fiber mat, resulting in mechanical stresses between these two components.

Therefore, to reduce the stresses resulting from the different thermal expansion coefficients, silicon interposers are also used. The silicon interposers can be processed in the manner conventional in the semiconductor sector. However, silicon-based interposers are very expensive to produce, and so efforts are increasingly being made to replace them with more cost-effective glass material, since the thermal expansion of glass can be matched to that of silicon.

In this context, it is found to be a challenge to process the glass into usable interposers. The prior art has not yet addressed, in particular, the economical production of the plurality of through-openings in the substrate for through-plating.

EP 2 503 859 A1 thus discloses a method in which a substrate is provided with through-holes, the substrate consisting of an insulator such as glass, for example silicate glass, sapphire, plastics material or ceramic and semiconductors such as silicon. The substrate is irradiated using a laser, for example a femtosecond laser, which is focused on a focal point at a desired position within the substrate. The through-holes are produced by a method in which the regions of the substrate which have been modified by the laser are dipped in an etching solution and the modified regions are thus removed from the substrate. This etching makes use of the effect whereby the modified region is etched extremely rapidly by comparison with the unmodified regions of the substrate. Blind holes or through-openings can be produced in this manner. A copper solution is suitable for filling the through-opening. To achieve a desired depth effect, in other words a through-hole between the outer substrate faces, the focal point has to be displaced during continuous irradiation, in other words tracked in the direction of the z-axis.

More generally, the combination of selective laser treatment with a subsequent etching process in the form of selective laser-induced etching is also known as ISLE (in-volume selective laser-induced etching). This method is used to produce microcomponents, tracks and shaped details in transparent materials such as glasses or sapphire. The miniaturization of products for microoptics, medical technology and microsystem technology requires the production of components having dimensions in the micrometer range and having structural precisions of up to 100 nm. The ISLE method is a suitable production method for structures made of and made in transparent materials. As a result of the laser radiation being focused in the interior of the workpiece, the material is structurally altered in a small volume (a few cubic micrometers). For example, the crystalline structure of sapphire is converted to an amorphous vitreous structure, which is etched 10,000 times more rapidly than the starting material. By moving the laser focus through the workpiece, coherent modified areas are produced, which are subsequently chemically etched in aqueous solution using potassium hydroxide or hydrofluoric acid and removed.

DE 10 2010 025 966 B4 discloses a method in which in a first step focused laser pulses are directed onto the substrate, the radiation intensity of said pulses being high enough to result in local athermal decomposition along a filament-like track in the glass. In a second method step, the filament-like tracks are expanded into holes by supplying high-voltage power to opposing electrodes, resulting in dielectric breakdowns through the substrate along the filament-like tracks. These breakdowns expand under electrothermal heating and evaporation of hole material, until the process is halted by switching off the power supply upon achieving the desired hole diameter. Alternatively or in addition, the tracks may also be expanded using reactive gases, which are directed onto the hole sites using nozzles. The through-opening sites may also be expanded using supplied etching gas. The comparatively complex process, resulting from the fact the substrate initially has to be broken through by the athermal decomposition and the diameter of the filament-like tracks has to be expanded into holes in the following step, has proved to be disadvantageous.

Further, U.S. Pat. No. 6,400,172 B1 discloses the introduction of through-openings in semiconductor materials by laser.

SUMMARY

In an embodiment, the present invention provides a substrate comprising glass, sapphire, silicon and/or aluminosilicate, and having at least one recess or through-opening. The at least one recess or through-opening is formed by anisotropic removal of substrate material by etching a portion of the substrate that has been modified by a pulse of laser radiation in a direction of a thickness of the substrate. The modified portion of the substrate extends along a beam axis of the laser radiation. The pulse of laser radiation was applied with a focus extending from a first focal depth positioned past one side of the substrate to a second focal depth located at an opposite side of the substrate.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1A:
FIG. 1a-c is a flow chart comprising a plurality of method steps for introducing a plurality of through-openings into a substrate by anisotropic material removal.

An embodiment of the invention provides an option for substantially simplifying a method and a device for producing through-openings, and in particular for reducing the time taken to carry this out. Further, a substrate produced by this method is provided according to another embodiment.

An embodiment of the invention provides a method for producing a plurality of recesses in a substrate using an optical system, a thickness of the substrate not exceeding 2 mm in a region of the recesses to be produced, the method comprising: applying pulsed laser radiation having a pulse duration (t) to the substrate material of the substrate, which is transparent at least in part to the laser wavelength, with the laser radiation being focused using the optical system having an original focal depth (f1) and an intensity of the laser radiation leading to a modification of the substrate along a beam axis (Z) of the laser radiation, but not to material removal which goes all the way through; and anisotropically removing material primarily in the regions which have previously undergone modification via the laser radiation, thereby producing a recess in the substrate, wherein the laser radiation is focused by the same optical system, which is unchanged per se, at a focal depth (f2) different from the original focal depth (f1), by non-linear self-focusing within the pulse duration (t) of an individual pulse (P)

An embodiment of the invention provides that the laser radiation is initially deflected through a transmissive medium, in particular a glass, the medium having a higher intensity-dependent refractive index than air, and is subsequently incident on the substrate, and the laser radiation is focused by non-linear self-focusing within the pulse duration of a single pulse by the unchanged optical system using a focal depth differing from the original focal depth. An embodiment of the invention makes use of the fact that the intensity of a pulsed laser is not constant for an individual pulse, but rather has an intensity which increases to a maximum and subsequently falls away over the temporal progression of the individual pulse. Because the refractive index also increases to a maximum as a result of the increasing intensity, in a manner corresponding to a normal distribution over the temporal progression for an individual pulse, the focal depth of the optical system, in other words the distance from a laser machining head or the lens, changes, independently of the geometric focal point determined by the focusing optics. This effect is effectively amplified by the transmissive medium, in such a way that the distance between the focal points between a maximum and a minimum intensity at least corresponds to the desired longitudinal extent, in other words to the depth of the recess to be produced. In a surprisingly simple manner, this results in a spatial displacement in the direction of the beam axis during the duration of an individual pulse, which leads to the desired modification in the region of the entire primary extension, in the direction of the beam axis, of the recesses which are subsequently to be formed. Tracking of the focal point, which is unavoidable in the prior art, can be omitted in this case. Thus, in particular, no control system for moving the laser focus through the substrate is required. Thus, according to an embodiment of the invention, not only is the control system outlay required for this purpose omitted, but the machining duration can also be considerably reduced, for example to the duration of an individual pulse. The non-linear refractive index of the transmissive medium is a linear function of the intensity, and so the selection of a suitable material and suitable dimensions is dependent on the intensity of the laser radiation used.

In this context, the laser beam is directed onto the substrate sufficiently briefly that the substrate is merely modified along a beam axis of the laser beam, without a recess which penetrates through the substrate occurring, anisotropic material removal being carried out in the next step only in the regions of the substrate which have previously undergone modification by means of the laser beam, and a recess or through-opening thus being provided in the substrate. Although there is still no conclusive understanding of the process according to the invention, it is currently being assumed that the laser action during the modification results in a chemical modification to the substrate material which only has slight effects on the physical properties or the external constitution of the substrate. The laser power input is used to excite or trigger a reaction and a modification by conversion, the effect of which is only made use of in the subsequent method step for the desired material removal.

Because the anisotropic material removal is carried out by an etching method, in particular by liquid etching, dry etching or vapor phase etching, or by high-voltage or high-frequency evaporation, it is possible to use a planar-action removal method, which only places very low requirements on the process, rather than a sequential one for the actual material removal. Instead, over the duration of action, the material duration can be carried out quantitatively and qualitatively for all regions which are pre-treated in the described manner and correspondingly modified, reducing the expenditure of time for producing the plurality of recesses or through-openings considerably overall.

The focal point at minimum intensity may be directed onto an outer surface of the substrate. However, it has already been found to be particularly promising if the laser radiation is focused onto a remote side of the substrate at a distance therefrom, in such a way that the focal point of the laser radiation is set so as to be positioned on a rear side, remote from the laser radiation, at a distance from the surface of the substrate. As a result, the laser beam is initially directed onto a focal point positioned outside the substrate. The refractive index which changes as a result of the increasing intensity subsequently leads to a spatial displacement of the focal point through the substrate along the beam axis. This ensures that a sufficiently high intensity for producing the modification is applied to every focal point within the substrate.

The duration of the beam action may, of course, comprise a plurality of pulse durations for an unchanged relative position of the laser machining head with respect to the substrate, for example so as further to optimize the modification of the substrate material. However, it is particularly advantageous if the laser beam is deflected onto each focal point for the duration of a single pulse. In this way, the previous and subsequent pulses of the laser beam are directed onto positions spaced apart in the plane of the substrate, in such a way that adjacent focal points are spaced apart in the plane of the substrate.

The modifications may be produced by laser machining in which positioning of the laser machining head and the laser machining alternate. However, constant relative movement between the laser beam or laser machining head and the substrate is preferably carried out while the laser radiation is deflected onto the substrate, in such a way that the laser beam is continuously guided in a "floating" movement over the substrate, in such a way that an interrupted change in the relative position results in an extremely rapid machining duration. In particular, the relative position of the substrate with respect to the laser beam can be changed at a constant speed, in such a way that for a constant pulse frequency the spacing of the modifications to be produced adheres to a predetermined grid dimension.

Particularly preferably, the laser is operated at a wavelength to which the substrate is transparent, ensuring penetration of the substrate. In particular, this ensures a substantially cylindrical modification region coaxial with respect to the laser beam axis, which leads to a constant diameter of the through-opening or recess.

Further, it may also be advantageous if the laser also additionally removes a surface region so as to configure the action region of the anisotropic removal in a manner resulting in a conical inlet region to the through-opening. In this manner, the subsequent through-plating is simplified. In addition, the action of an etching agent is concentrated in this region, for example.

The pulse duration can be reduced considerably by comparison with the methods known in the art. In a particularly advantageous embodiment of the method according to the invention, the laser can be operated at a pulse duration of less than 50 ps, preferably less than 20 ps.

In another, also particularly promising embodiment of the invention, the substrate is provided, in particular after the modification, with a planar metal layer covering at least some, in particular a large number, of through-openings which are subsequently to be produced. In a following step, the modified regions are removed in such a way that a recess sealed on one side by the metal layer is produced. The metal layer is preferably applied after the modification but before the material removal, in such a way that after the material removal the metal layer, applied for example as a conductor trace, seals the recess and thus simultaneously forms an optimum base for contacting to be applied thereto. The through-plating takes place in the region of the recess by methods known per se. By applying the metal layer as a conductor trace, it is also possible to produce a desired circuit diagram in a simple manner.

In another, also particularly promising embodiment of the method, the substrate is coated in a planar manner with an etch resist on at least one surface prior to the laser treatment. As a result of the action of a laser beam, the etch resist is removed on at least one surface in a dot-like action region and the modification is produced in the substrate simultaneously. In this way, the unmodified regions are protected against undesired action in the subsequent etching process, and the surface is therefore not damaged. The etch resist does not prevent the modification of the substrate positioned below. Rather, the etch resist is either permeable to the laser radiation or it is removed in a near dot-like manner by the laser radiation, that is to say evaporated, for example. Further, the possibility is not excluded that the etch resist may contain substances which act to promote the modification, for example which accelerate the modification process.

Before the etch resist is applied to one of the outer surfaces of the substrate, the above-described metal layer may, of course, be applied so as to use it as a base for the desired through-plating after the etch resist is removed.

The etch resist may remain on the surface of the substrate after the end of the treatment. Preferably, however, the etch resist is removed from the surface of the substrate in a manner known per se after the anisotropic material removal.

Fundamentally, the method is not limited to particular material compositions of the substrate. However, it is particularly promising for the substrate to comprise an aluminosilicate, in particular a boroaluminosilicate, as a significant material proportion.

An embodiment of the invention provides a device comprising a laser machining head for deflecting laser radiation onto a substrate, the device being equipped with a transmissive medium, which in particular is provided with at least one planar face or is, for example, configured as a planar plate, and which has a higher intensity-dependent refraction index than air, and which is arranged between the laser machining head and the substrate in such a way that the laser radiation can be deflected through the transmissive medium onto the substrate. As a result, according to an embodiment of the invention, the intensity-dependent refractive index of the transmissive medium is exploited so as to produce an axial change in the focal point during the duration of each individual pulse and the accompanying fluctuation in intensity during the individual pulse, in connection with a pulsed laser. Thus, unlike in the prior art, the focal point is not unchanged, at least during the duration of an individual pulse, but rather the focal point is displaced along a line on the beam axis with respect to the total duration of the individual pulse. It is easy to see what significant advantages result in the present invention from the fact that the focal point is displaced without tracking of the focusing optics of the laser machining head. In particular, this greatly reduces the machining duration and also the control system outlay. For example, in a planar substrate the tracking of the z-axis can be omitted.

In principle, a variant is also conceivable in which the transmissive medium is arranged on the laser machining head upstream of focusing optics thereof in the direction of the beam path, in such a way that the laser radiation is initially directed through the transmissive medium and subsequently through the focusing optics onto the substrate.

The effect of the intensity-dependent light refraction can, of course, be adapted to the respective application, for example in that the transmissive medium is adapted or replaced accordingly or in that the laser beam passes through a plurality of transmissive media or through the same medium repeatedly.

The focal point may be directed onto a rear face of the substrate, remote from the laser machining head, and the transmissive medium may be formed in such a way that the intensity-dependent focal point reaches a front face, facing the laser machining head, at the intensity maximum. However, it is particularly expedient in practice if the laser radiation can be deflected onto a focal point at a distance from a rear face of the substrate, remote from the laser machining head, in such a way that the rear face of the substrate is reached during the increasing intensity progression rather than at an intensity minimum. This ensures a laser radiation intensity within the substrate which is always sufficient for the modification which is to be achieved.

In principle, any pulsed laser is suitable for the machining, a laser having a pulse duration of less than 50 ps, preferably less than 20 ps, having been found to be particularly expedient.

In addition, it is particularly expedient if, for focusing, the laser machining head has focusing optics having a numerical aperture (NA) greater than 0.3, in particular greater than 0.4.

A particularly promising embodiment of the device according to the invention is also achieved in that the focusing optics have a gradient index lens. As a result of a lens of this type, also known as a GRIN lens, the refractive index which decreases in the radial direction results in the reduction in intensity which otherwise occurs being generally compensated in the edge region of the lens.

It is further found to be advantageous if the transmissive medium consists of glass, in particular quartz glass, so as to provide a pronounced intensity-dependent refractive index.

In this context, the transmissive medium is preferably connected to the laser machining head and arranged so as to be movable together therewith and arranged in particular replaceably on the laser machining head. Rapid fixing, for example, is suitable for this purpose.

Preferably, the device is equipped with a continuously emitting laser in addition to a pulsed laser, the transmissive medium being transparent to the wavelength of the continuously emitting laser, and the continuously emitting laser being directed onto the substrate through the medium or directed onto the substrate while circumventing the transmissive medium. The wavelengths of the pulsed laser and of the continuously emitting laser may be different. Further, the laser radiation from the different laser sources may be directed onto the substrate from different sides.

Figure 1B:
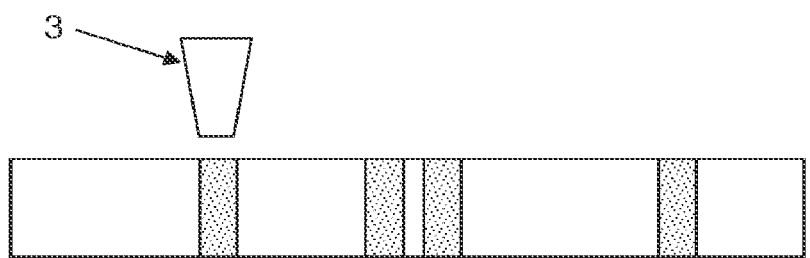
Figure 1C:
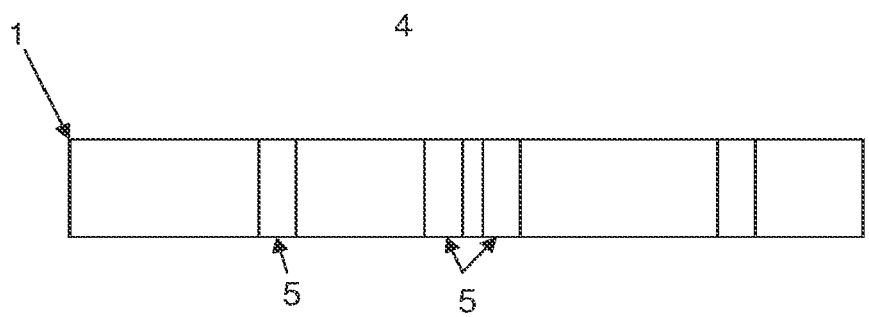

FIG. 1 shows the individual method steps of introducing a plurality of through-openings into an interposer 1, intended as a contacting element in circuit board production, comprising a substrate 2. For this purpose, laser radiation 3 is directed onto the surface of the substrate 2. The substrate 2 comprises a boroaluminosilicate as a significant material proportion, so as to ensure thermal expansion similar to that of silicon. The material thickness d of the substrate 2 is between 50 µm and 500 µm. The duration of action of the laser radiation 3 is selected to be extremely short, in such a way that merely a modification of the substrate 2 occurs concentrically about a beam axis of the laser beam, without resulting in significant through-destruction or a recess in the substrate material. In particular, the duration of action is limited to the individual pulse. For this purpose, the laser is operated at a wavelength to which the substrate 2 is transparent. A region 4 modified in this manner is shown in FIG. 1b. In a following method step, shown in FIG. 1c, the action of an etching liquid or etching gas leads to anisotropic material removal in the regions 4 of the substrate 2 which have previously undergone modification by the laser radiation 3. This results in a recess 5 as a through-opening in the substrate 2 along the cylindrical action region.

Figure 2A:
FIG. 2a-d shows a method variant in which a metal layer is applied prior to the anisotropic material removal.
Figure 2B:
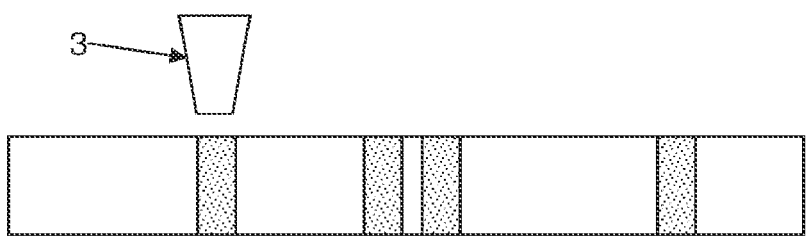
Figure 2C:
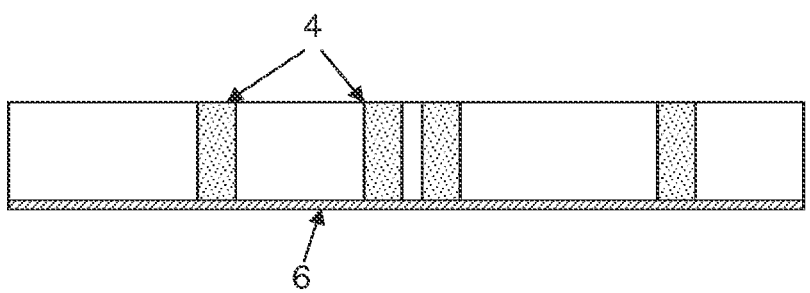
Figure 2D:
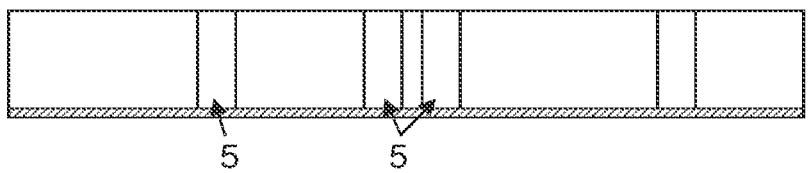
Figure 3A:
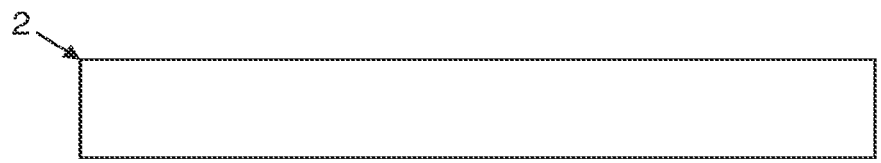
FIG. 3a-e shows a further method variant in which an etch resist is applied to the substrate in a first method step.
Figure 3B:
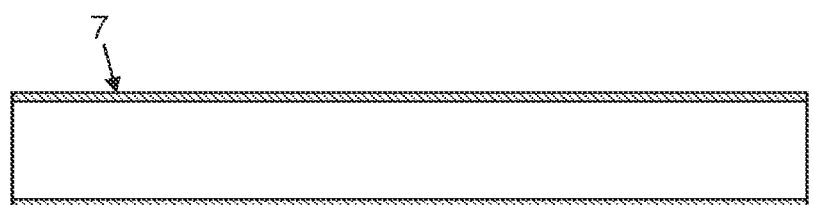
Figure 3C:
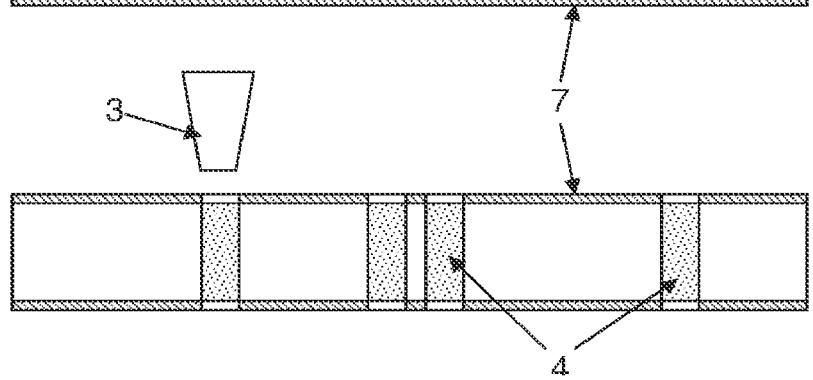
Figure 3D:
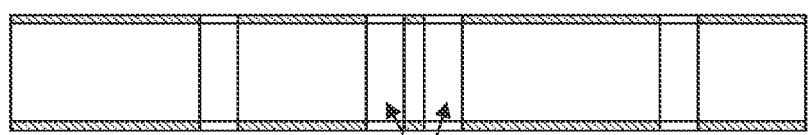
Figure 3E:
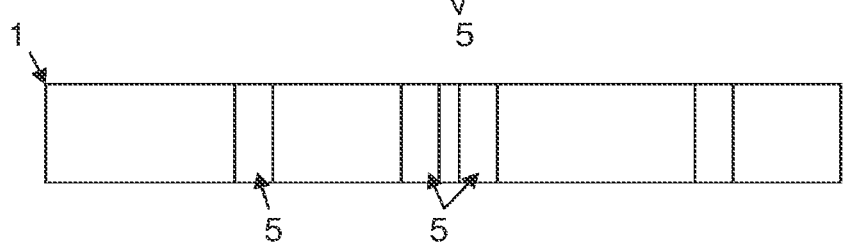

FIG. 2 shows a modification of the same method, in which, after the modification by the laser radiation 3 shown in FIG. 2b, the substrate 2 is provided with a planar metal layer 6, as can be seen in FIG. 2c. In the next method step, shown in FIG. 2d, the anisotropic material removal in the modified regions 4 results in recesses 5, which are sealed on one side by the metal layer 6 and which form the basis for subsequent contacting.

A further variant of the method is shown in FIG. 3. Prior to the laser treatment using the laser radiation 3, the substrate 2 is coated on both sides with an etch resist 7, shown in FIG. 3b. As a result of the action of the laser radiation 3, removal of the etch resist 7 and modification of the region of the substrate 2 positioned therebelow, as shown in FIG. 3c, occur simultaneously in a dot-like action region. The unmodified regions of the surface of the substrate 2 are thus protected against undesired action in the subsequent etching process, which results in the anisotropic material removal by a liquid etching method and the occurrence of corresponding recesses 5 in the substrate 2, as is shown in FIG. 3d. As is shown in FIG. 3e, the etch resist 7, which is superfluous after the end of the etching method, is removed by a stripping method.

Figure 4A:
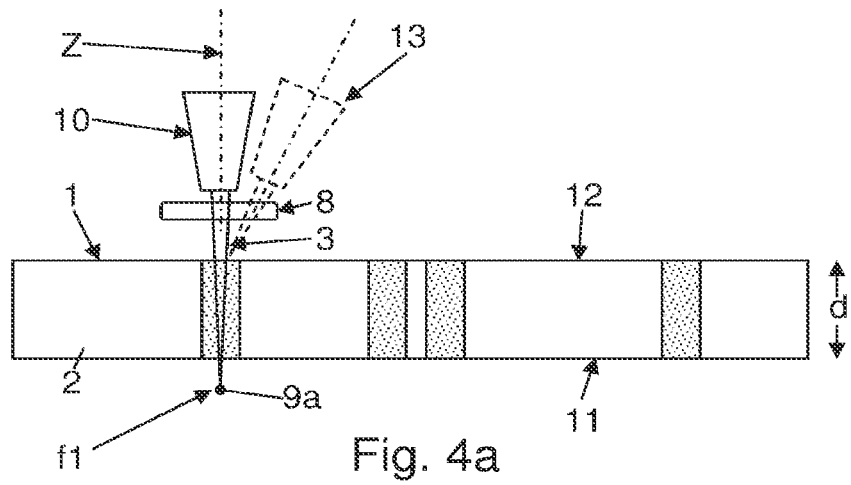
FIG. 4a-c shows the intensity-dependent focal point during an individual pulse.
Figure 4B:
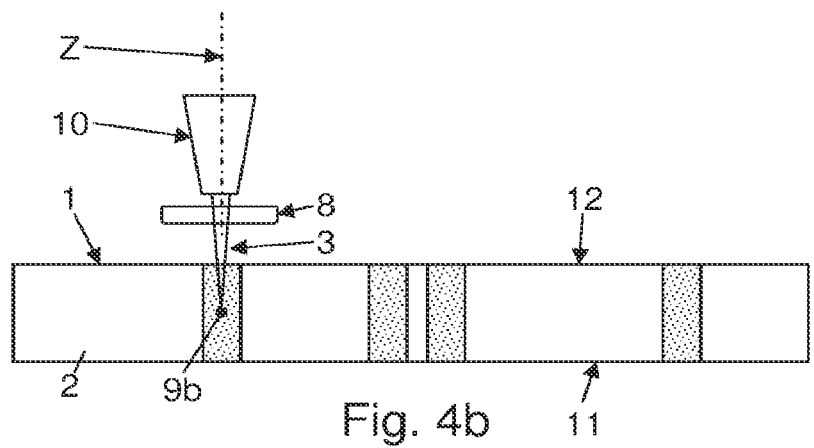
Figure 4C:
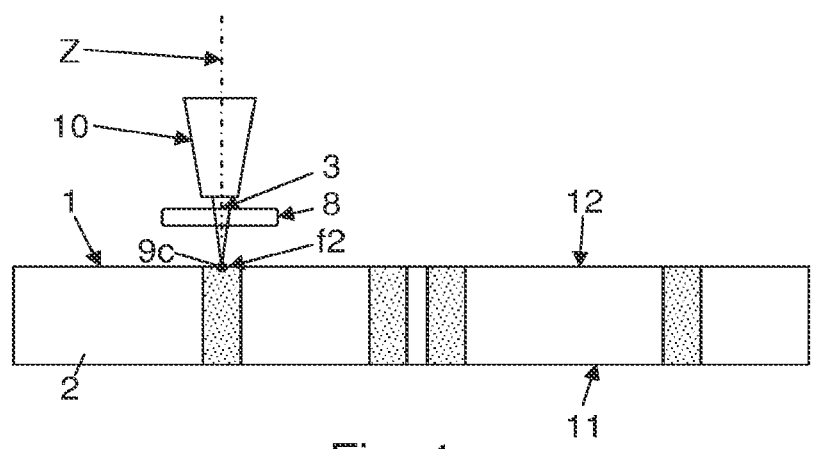
Figure 5:
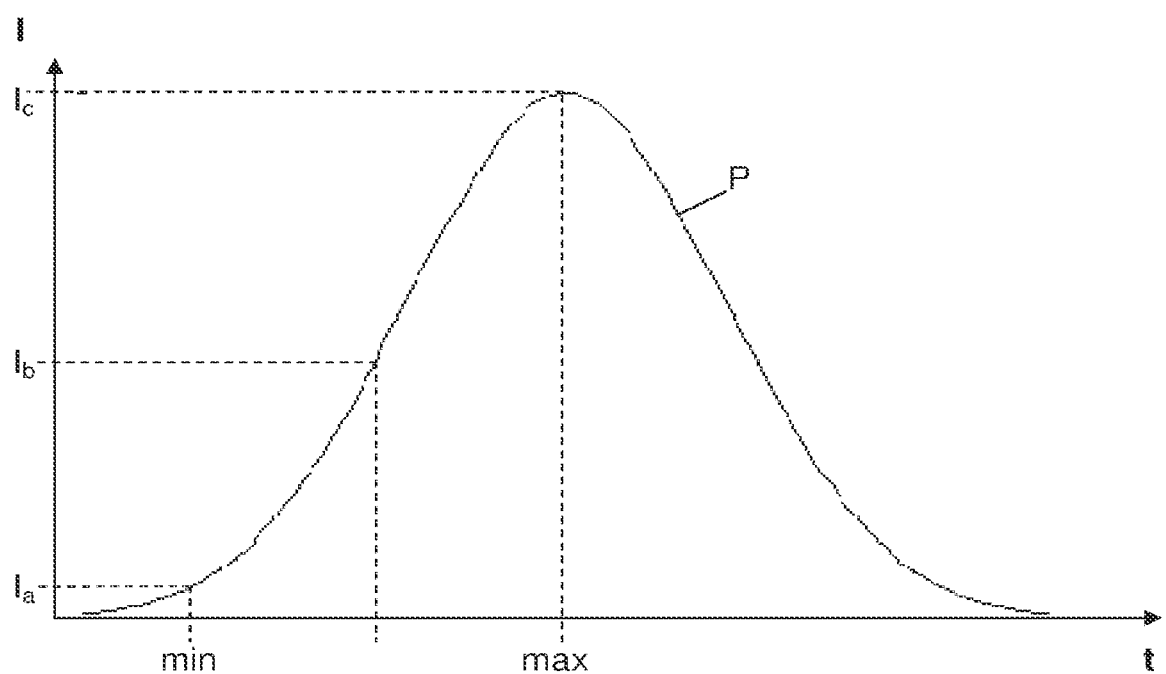
FIG. 5 is a graph showing the intensity distribution over time during the duration of an individual pulse.

The following describes in more detail an important effect during the laser machining of the substrate 2 with reference to FIGS. 4 and 5. This is the intensity-dependent focal point during an individual pulse P. The invention is based on the finding that the intensity I of an individual pulse P of the laser radiation 3 is not constant, but rather has an intensity which increases from a minimum $I_a$ through an average $I_b$ to a maximum $I_c$ and subsequently decreases over the temporal progression of the individual pulse as shown in FIG. 5, for example, in accordance with a normal distribution. Simultaneously, as a result of the variable intensity I, the refractive index, in particular also of a transmissive medium 8, changes in relation to an individual pulse P over the temporal progression t. As a result, the intensity-dependent focal points 9a, 9b, 9c of the laser radiation 3, which are shown in FIGS. 4a to 4c, also change independently of the geometric focal point determined by focusing optics of a laser machining head 10. This effect is amplified by the transmissive medium 8, for example made of glass, which is arranged between the laser machining head 10 and the substrate 2 and which has a greater intensity-dependent refractive index than air, in such a way that the distance between the focal points 9a, 9c between a maximum intensity $I_c$ and a minimum intensity $I_a$ at least corresponds to the desired longitudinal extension, in other words to the depth of the recess to be produced or, if, as shown, a through-hole is to be produced, to the material thickness d of the substrate 2. The intensity-dependent focal point 9a, 9b, 9c thus migrates along the beam axis Z from a position, which is shown in FIG. 4a and is at a distance from a rear face 11 of the substrate 2, in the direction of the laser machining head 10, and thus reaches all positions along the beam axis Z between the rear face 11 and a front face 12 facing the laser machining head 10 in a continuous movement, in such a way that the desired modification occurs in the region of the entire primary extension of the recesses which are subsequently to be produced.

Additionally, FIG. 4a shows, merely schematically, an additional laser machining head 13, which, to supplement a continuously emitting laser source connected to the laser machining head 10, directs the laser radiation 3 of a pulsed laser onto the substrate 2 selectively through or circumventing the transmissive medium 8. As a result, the intensity I, shown in FIG. 5, of an individual pulse P of the laser radiation 3 is accordingly amplified by the intensity of the continuously emitting laser source.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

What is claimed is:

1. A substrate comprising glass, sapphire, silicon and/or aluminosilicate, and having at least one recess or through-opening formed by:
   anisotropic removal of substrate material by etching a portion of the substrate that has been modified by a pulse of laser radiation in a direction of a thickness of the substrate, wherein the modified portion of the substrate extends along a beam axis of the laser radiation, and wherein the pulse of laser radiation was applied with a focus extending from a first focal depth positioned past one side of the substrate to a second focal depth located at an opposite side of the substrate.

2. The substrate according to claim 1, wherein the thickness of the substrate does not exceed 2 mm in a region of the at least one recess or through-opening.

3. The substrate according to claim 1, wherein the thickness of the substrate is between 50 µm and 500 µm.

4. The substrate according to claim 1, comprising the through-opening formed by the anisotropic material removal by etching across the thickness of the substrate.

5. The substrate according to claim 4, further comprising a plurality of further through-openings formed in the same manner as the through-opening, the through-openings being adjacent to each other with a lateral spacing.

6. The substrate according to claim 1, comprising the at least one recess that is sealed at one end by a metal layer that was applied after the laser radiation to one side of the substrate that is located opposite to a side of the substrate on which the etching into the substrate occurred.

7. The substrate according to claim 6, wherein the metal layer is applied as a conductor trace.

8. The substrate according to claim 7, wherein the recess has a through-plating of metal connected to the conductor trace.

9. The substrate according to claim 1, wherein the at least one recess or through-opening has a through plating of metal applied after the etching.

10. The substrate according to claim 1, further comprising an etch resist layer applied to at least one side of the substrate, wherein the pulse of laser radiation has removed a dot-like portion of the etch resist layer at the region of the at least one recess or through-hole prior to the etching.

11. The substrate according to claim 1, wherein the second focal depth is located past the opposite side of the substrate such that a length between the focal depths is greater than and extends across the thickness of the substrate.

12. The substrate according to claim 1, wherein the laser radiation was applied such that a distance between a maximum intensity and a minimum intensity of the pulse of laser radiation is greater than a predetermined longitudinal extent of the recess or the though-opening to be produced by the etching.

13. The substrate according to claim 12, wherein the laser radiation was applied such that the first focal depth is positioned past one side of the substrate with the minimum intensity which increases to the maximum intensity as the focus of the pulse of laser radiation shifted from the first focal depth to the second focal depth.

14. The substrate according to claim 1, wherein the first or the second focal depth is disposed past a rear face of the substrate remote in a direction of the laser radiation along the beam axis.

15. The substrate according to claim 1, wherein the modified portion of the substrate does not have substrate material removed to an extent that a recess into the substrate is formed prior to the etching.

16. The substrate according to claim 1, wherein the at least one recess or through-opening has a conical inlet region formed by the pulse of laser radiation removing a surface region of the substrate, and by the etching beginning at the removed surface region and then proceeding along the modified portion of the substrate.

17. The substrate according to claim 1, wherein the etching into the substrate first occurs at a surface region of the substrate that is not removed by the laser radiation.

18. The substrate according to claim 1, wherein the etching was performed by immersing the substrate in an etching medium.

19. The substrate according to claim 1, comprising the through-hole and a plurality of further through-openings formed in the same manner as the through-opening, an arrangement of the though-openings corresponding to an arrangement of electrical contact points of a circuit board.

20. The substrate according to claim 1, being formed of the glass.

21. An interposer comprising the substrate according to claim 1 having the through-opening and a plurality of further through-openings formed in the same manner as the through-opening, each of the through-openings having a through-plating of metal connected to conductor traces at opposite sides of the substrate.

* * * * *